US010770595B2

United States Patent
Tian et al.

(10) Patent No.: US 10,770,595 B2
(45) Date of Patent: Sep. 8, 2020

(54) THIN FILM TRANSISTOR, METHOD FOR MANUFACTURING THE SAME, AND DISPLAY DEVICE

(71) Applicant: BOE TECHNOLOGY GROUP CO., LTD., Beijing (CN)

(72) Inventors: Xueyan Tian, Beijing (CN); Zunqing Song, Beijing (CN); Xiaolong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/427,743

(22) Filed: May 31, 2019

(65) Prior Publication Data
US 2019/0378931 A1 Dec. 12, 2019

(30) Foreign Application Priority Data
Jun. 7, 2018 (CN) .......................... 2018 1 0581005

(51) Int. Cl.
*H01L 29/786* (2006.01)
*H01L 29/66* (2006.01)
*H01L 21/324* (2006.01)
*H01L 27/12* (2006.01)

(52) U.S. Cl.
CPC ...... *H01L 29/78633* (2013.01); *H01L 21/324* (2013.01); *H01L 27/1222* (2013.01); *H01L 29/66757* (2013.01)

(58) Field of Classification Search
CPC ......... H01L 29/66757; H01L 29/78633; H01L 29/78675; H01L 27/1222; H01L 27/3262; H01L 21/234
See application file for complete search history.

(56) References Cited

U.S. PATENT DOCUMENTS

| 2013/0043479 A1* | 2/2013 | Kim ................. H01L 29/78696 257/60 |
| 2019/0206904 A1* | 7/2019 | Zhou ................. H01L 29/42356 |

\* cited by examiner

*Primary Examiner* — Peniel M Gumedzoe
(74) *Attorney, Agent, or Firm* — Nath, Goldberg & Meyer; Joshua B. Goldberg

(57) ABSTRACT

A thin film transistor, a method for manufacturing the same and a display device are provided in the present disclosure. The thin film transistor includes an active layer, a first electrode and a second electrode, and a gate electrode. The active layer includes an active layer body and an electrode hole in a center of the active layer body. The gate electrode is insulated and spaced apart from the active layer body and is disposed to surround the electrode hole. The first electrode and the second electrode are insulated from each other, both coupled to the active layer body, and insulated and spaced apart from the gate electrode. At least a portion of an orthographic projection of the first electrode on the active layer is within the electrode hole. An orthographic projection of the second electrode on the active layer surrounds the active layer body.

16 Claims, 3 Drawing Sheets

THIN FILM TRANSISTOR, METHOD FOR MANUFACTURING THE SAME, AND DISPLAY DEVICE

CROSS-REFERENCE TO RELATED APPLICATIONS

The present disclosure claims the priority of Chinese Patent Application No. 201810581005.6, filed on Jun. 7, 2018, the contents of which are incorporated herein by reference in its entirety.

TECHNICAL FIELD

The application relates to the field of display device, and in particular to a thin film transistor, a method for manufacturing the same, an array substrate including the thin film transistor and a display device including the array substrate.

BACKGROUND

With the development of display technology, the resolution of a display device is required to be higher and higher. The higher the resolution is, the smaller the size of a pixel unit should be, which increases the difficulty in manufacturing the display device. For an organic light-emitting diode display device, a plurality of thin film transistors are provided in each pixel unit. Since the organic light-emitting diode display device has a high resolution, each thin film transistor in the pixel unit has a smaller size, which requires higher manufacturing precision.

SUMMARY

According to an aspect of the disclosure, a thin film transistor is provided, which includes: a base substrate; an active layer, including an active layer body and a through-hole in a center of the active layer body; a gate electrode, insulated and spaced apart from the active layer body and disposed to surround the through-hole; and a first electrode and a second electrode, both located on a side of the gate electrode distal to the base substrate. The first electrode and the second electrode are insulated and spaced apart from each other, both coupled to the active layer body, and insulated and spaced apart from the gate electrode. At least a portion of an orthographic projection of the first electrode on the active layer is within the through-hole. An orthographic projection of the second electrode on the active layer surrounds the active layer body.

In an embodiment, the orthographic projection of the second electrode on the active layer is overlapped with an outer edge of the active layer body.

In an embodiment, the thin film transistor further includes a gate insulating layer on a surface of the active layer proximal to the gate electrode. The gate electrode is on a surface of the gate insulating layer distal to the base substrate.

In an embodiment, the thin film transistor further includes an insulating spacer layer which is on a side of the gate insulating layer distal to the base substrate and covers the gate electrode. The first electrode and the second electrode are on a surface of the insulating spacer layer distal to the base substrate. The first electrode is coupled to the active layer body via a first via-hole penetrating through both the insulating spacer layer and the gate insulating layer. The second electrode is coupled to the active layer body via a second via-hole penetrating through both the insulating spacer layer and the gate insulating layer.

In an embodiment, an orthographic projection of the through-hole on the base substrate has a circle shape; an orthographic projection of the active layer body on the base substrate has an annular shape; an orthographic projection of the first electrode on the base substrate has a circle shape; and each of orthographic projections of the second electrode and the gate electrode on the base substrate has an annular shape.

In an embodiment, an orthographic projection of the first via-hole on the active layer has an annular shape and surrounds the through-hole; and an orthographic projection of the second via-hole on the active layer has an annular shape and surrounds the through-hole.

In an embodiment, the first electrode, the gate electrode, and the second electrode are disposed concentrically.

In an embodiment, the active layer body is made of low temperature polysilicon.

In an embodiment, the thin film transistor further includes a light shielding layer on a side of the active layer proximal to the base substrate, and an orthographic projection of the active layer body on the light shielding layer is within the light shielding layer.

According to an aspect of the disclosure, a method for manufacturing a thin film transistor is provided, and the method includes: providing a base substrate; forming an active layer on a side of the base substrate, where the active layer includes an active layer body and a through-hole in a center of the active layer body; forming a gate electrode on a same side of the base substrate as the active layer, where the gate electrode is insulated and spaced apart from the active layer body and disposed to surround the through-hole; and forming a first electrode and a second electrode both located on a side of the gate electrode distal to the base substrate, where the first electrode and the second electrode are insulated and spaced apart from each other, both coupled to the active layer body, and insulated and spaced apart from the gate electrode. At least a portion of an orthographic projection of the first electrode on the active layer is within the through-hole. An orthographic projection of the second electrode on the active layer surrounds the active layer body.

In an embodiment, the method further includes: forming a gate insulating layer on a surface of the active layer proximal to the gate electrode, wherein the gate electrode is on a surface of the gate insulating layer distal to the base substrate.

In an embodiment, after forming the gate electrode and before forming the first electrode and the second electrode, the method further includes: forming an insulating spacer layer, where the insulating spacer layer is on a side of the gate insulating layer distal to the base substrate and covers the gate electrode; forming a first via-hole and a second via-hole both of which penetrate through both the insulating spacer layer and the gate insulating layer; and filling a material of the first electrode into the first via-hole to form a first connection portion, and filling a material of the second electrode into the second via-hole to form a second connection portion. The first electrode is coupled to the active layer body via the first connection portion, and the second electrode is coupled to the active layer body via the second connection portion.

In an embodiment, an orthographic projection of the through-hole on the base substrate has a circle shape; an orthographic projection of the active layer body on the base substrate has an annular shape; an orthographic projection of the first electrode on the base substrate has a circle shape;

and each of orthographic projections of the second electrode and the gate electrode on the base substrate has an annular shape.

In an embodiment, an orthographic projection of the first via-hole on the active layer has an annular shape and surrounds the through-hole; and an orthographic projection of the second via-hole on the active layer has an annular shape and surrounds the through-hole.

In an embodiment, the first electrode, the gate electrode, and the second electrode are disposed concentrically.

In an embodiment, before forming the active layer, the method further includes: forming a light shielding layer on a side of the active layer proximal to the base substrate. An orthographic projection of the active layer body on the light shielding layer is within the light shielding layer.

In an embodiment, forming the active layer includes: forming an amorphous silicon layer; performing an annealing process on the amorphous silicon layer to obtain a low temperature polysilicon layer; performing a chemical mechanical polishing process on the low temperature polysilicon layer; and performing a patterning process on the polished low temperature polysilicon layer to obtain the active layer.

According to an aspect of the disclosure, a display device including the thin film transistor is provided.

BRIEF DESCRIPTION OF THE DRAWINGS

The accompanying drawings, which provide a further understanding of the disclosure and constitute a part of the specification, are used in conjunction with the following specific embodiments to explain the disclosure, but are not intended to limit the disclosure.

DETAILED DESCRIPTION

The embodiments of the present disclosure will be described in detail below with reference to the accompanying drawings. It is to be understood that the embodiments described herein are merely used for describing and explaining the present disclosure rather than limiting of the present disclosure.

Figure 1:
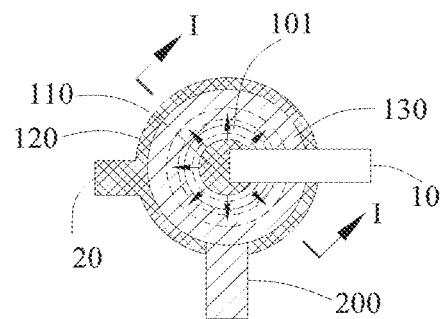
FIG. 1 is a top view of a thin film transistor according to an embodiment of the present disclosure.
Figure 2:
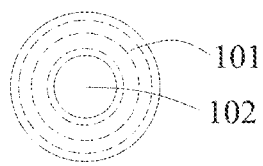
FIG. 2 is a schematic diagram of an active layer of the thin film transistor according to an embodiment of the present disclosure.

According to an aspect of the present disclosure, a thin film transistor is provided. As shown in FIG. 1, the thin film transistor includes an active layer, a first electrode 110, a second electrode 120, and a gate electrode 130. As shown in FIG. 2, the active layer includes an active layer body 101, and an electrode hole or through-hole 102 formed in the center of the active layer body 101. The first electrode 110 may be one of a source electrode and a drain electrode, and the second electrode 120 may be the other of the source electrode and the drain electrode. The first electrode 110 is insulated and spaced apart from the second electrode 120.

At least a portion of an orthographic projection of the first electrode 110 on the active layer is within the electrode hole 102. An orthographic projection of the second electrode 120 on the active layer surrounds the active layer body 101. The first electrode 110 and the second electrode 120 are both coupled to the active layer body 101. The gate electrode 130 is insulated and spaced apart from the active layer, the first electrode 110, and the second electrode 120. In an embodiment, the orthographic projection of the second electrode 120 on the active layer is overlapped with an outer edge of the active layer body 101. In an embodiment, an outer profile of the active layer body 101 is inside an outer profile of the orthographic projection of the second electrode 120 on the active layer, and the outer profile of the orthographic projection of the second electrode 120 on the active layer surrounds or encircles the outer edge of the active layer body 101.

Figure 3:
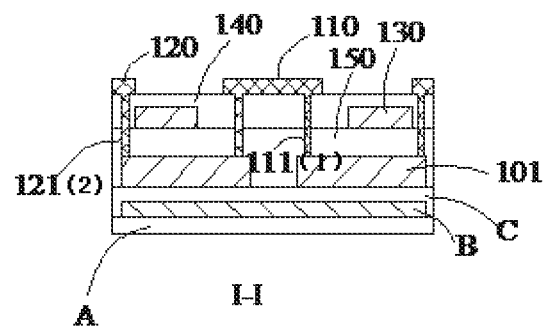
FIG. 3 is a cross-sectional view taken along line of the thin film transistor shown in FIG. 1.

In the present disclosure, the feature that "the at least a portion of the orthographic projection of the first electrode 110 on the active layer is within the electrode hole 102" is not particularly limited. For example, as shown in FIG. 3, the first electrode 110 and the second electrode 120 are spaced apart from the active layer body 101 in a thickness direction.

In order to insulate the active layer body 101 from the gate electrode 130, the thin film transistor may further include a gate insulating layer 150 disposed between the gate electrode 130 and the active layer. The gate electrode 130 surrounds the electrode hole 102.

In the present disclosure, the thin film transistor is not limited to a specific type, for example, the thin film transistor may be a top-gate thin film transistor or a bottom-gate thin film transistor. In the embodiment shown in FIG. 3, the thin film transistor is a top-gate thin film transistor. Specifically, the gate insulating layer 150 is disposed above the active layer body 101, and the gate 130 electrode is disposed on the gate insulating layer 150. An insulating spacer layer 140 covers (for example, completely covers) the gate electrode 130. The first electrode 110 and the second electrode 120 are disposed on the insulating spacer layer 140. The first electrode 110 is coupled to the active layer body 101 via a first via-hole 111 which penetrates through both the insulating spacer layer 140 and the gate insulating layer 150, and the second electrode 120 is coupled to the active layer body 101 via a second via-hole 121 which penetrates through both the insulating spacer layer 140 and the gate insulating layer 150.

In an embodiment, the first via-hole 111 and the second via-hole 121 are both annular holes. That is, an orthographic projection of the first via-hole 111 on a base substrate A (or the active layer) has an annular shape, and an orthographic projection of the second via-hole 121 on the base substrate A (or the active layer) has an annular shape as well.

The orthographic projection of the first via-hole 111 on the active layer surrounds the electrode hole 102. In an embodiment, the first electrode 110, the gate electrode 130, and the second electrode 120 are disposed concentrically.

The material of the insulating spacer layer 140 may be silicon oxide or silicon nitride. Alternatively, the material of the insulating spacer layer 140 may also be a mixture of silicon oxide and silicon nitride.

In a case that the thin film transistor is applied in a circuit, a first reference voltage is received by the first electrode 110, a turn-on voltage is received by the gate electrode 130, and a second reference voltage is received by the second electrode 120. Under the excitation of the turn-on voltage applied to the gate electrode 130, carriers in the active layer body 101 are activated, and carriers flow between the first electrode 110 and the second electrode 120. Since at least a portion of the orthographic projection of the first electrode 110 on the active layer is on an inner side the of the active layer body 101 in a radial direction, and at least a portion of the orthographic projection of the second electrode 120 on the active layer is on an outer side of the active layer body 101 in the radial direction, therefore, a moving path of the carriers in the active layer body 101 is a divergent transmission path from the inner side to the outer side of the active layer body 101 (as shown by the arrows in FIG. 1), thereby improving the migration rate of the carriers and improving the performance of the thin film transistor, for example, improving the switching performance and output performance of the thin film transistor.

In the present disclosure, the electrode hole 102 is not limited to a specific shape. In order to improve the uniformity of crystal grains of the active layer body 101, as shown in FIGS. 2 and 3, an orthographic projection of the electrode hole 102 on the base substrate A has a circular shape, an orthographic projection of the active layer body 101 on the base substrate has an annular shape, and an orthographic projection of the first electrode 110 on the base substrate has a circular shape. The gate electrode 130 has an annular shape and surrounds the first electrode 110, and an orthographic projection of the gate electrode 130 on the base substrate A has an annular shape. The second electrode 120 has an annular shape and surrounds the gate electrode 130, and an orthographic projection of the second electrode 120 on the base substrate A has an annular shape.

Since the electrode hole 102 is a circular through-hole and the active layer body 101 has an annular shape, and since the first electrode 110, the gate electrode 130, and the second electrode 120 are concentrically disposed, the dimensions of the active layer body 101 in a direction 360° around the central axis of the electrode hole 102 are the same. Also, the dimensions of the transmission path of the carriers in a direction of 360° around the central axis of the electrode hole 102 are the same, thereby ensuring uniform transmission of the carriers in various directions.

Figure 9:
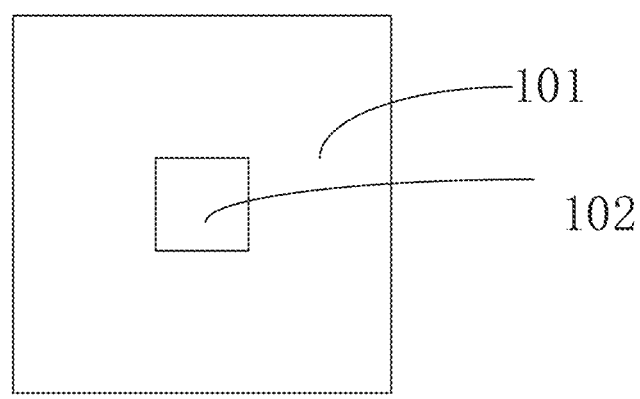
FIG. 9 is a schematic diagram of an active layer of a thin film transistor according to an embodiment of the present disclosure.

In another embodiment, as shown in FIG. 9, the orthographic projection of the electrode hole 102 on the base substrate A may also has a square shape, and the orthographic projection of the active layer body 101 on the base substrate A may have a square-hole shape. In this case, the orthographic projection of the first electrode 110 on the base substrate A may have a square shape. The gate electrode 130 may have a square-hole shape surrounding the first electrode 110, and the orthographic projection of the gate electrode 130 on the base substrate A may have a square-hole shape. The second electrode 120 may have a larger square-hole shape surrounding the gate electrode 130, and the orthographic projection of the second electrode 120 on the base substrate A may have a larger square-hole shape. It should be noted that the shapes of the electrode hole 102, the active layer body 101, the first electrode 110, the gate electrode 130, and the second electrode 120 are not limited thereto, as long as uniform transmission of the carriers in various directions can be realized.

Signals can be applied to the respective electrodes of the thin film transistor through lead wires. For example, in the embodiment shown in FIG. 1, a first electrode lead wire 10 may be coupled to the first electrode 110 to provide a signal to the first electrode 110, a second electrode lead wire 20 may be coupled to the second electrode 120 to provide a signal to the second electrode 120, and a gate line 200 may be coupled to the gate electrode 130 to provide a signal to the gate electrode 130.

Of course, the thin film transistor according to the present disclosure is not limited to the specific structure shown in FIG. 3. The gate electrode 130 is above the active layer in FIG. 3, and the gate electrode 130 may also be disposed under the active layer to obtain a bottom-gate thin film transistor.

In the present disclosure, the active layer body 101 is not limited to a specified material. For example, in an embodiment, the active layer body 101 may be made of a material of low temperature polysilicon. When the active layer body 101 is formed, an amorphous silicon layer may be formed first, and then the amorphous silicon layer is annealed to re-crystallize the amorphous silicon layer to obtain a polysilicon layer. Finally, the polysilicon layer is patterned to obtain the active layer including the active layer body 101 and the electrode hole 102.

In an embodiment, since the active layer body 101 has an annular shape, crystal grains in the polysilicon layer of the active layer body 101 are oriented in a uniform annular shape (shown by a dotted circle as shown in FIG. 1).

In a pixel circuit of an organic light emitting diode display device, the thin film transistor can be used as a driving thin film transistor. Each organic light emitting diode display device includes a plurality of pixel circuits, and thus the each organic light emitting diode display device includes a plurality of driving thin film transistors. Since the crystal grains in the material of the active layer body are oriented in a uniform annular shape in each of the plurality of driving thin film transistors, threshold voltages of all the driving thin film transistors are very close to each other or even completely the same without any the threshold voltage offset, therefore it is no required to provide a compensation module for compensating the driving thin film transistor in the pixel circuit, thereby simplifying the structure of the pixel circuit.

Since the pixel circuit has a simple structure, more pixel units per unit area can be arranged to realize a high-resolution display device. Moreover, since the pixel circuit has a simple structure, the manufacturing precision of the display device is low, thereby reducing the manufacturing cost of the display device.

In an embodiment, the thin film transistor may be a P-type thin film transistor. When using the P-type thin film transistor, one of the first electrode 110 and the second electrode 120 is electrically coupled to a high-level signal terminal and is used as a source electrode of the thin film transistor; and the other of the first electrode 110 and the second electrode 120 is electrically coupled to a low-level signal terminal and is used as a drain electrode of the thin film transistor.

For example, the first electrode 110 may be electrically coupled to the high-level signal terminal to serve as the source electrode of the thin film transistor; and the second electrode 120 may be electrically coupled to the low-level signal terminal to serve as the drain electrode of the thin film transistor.

Alternatively, the second electrode 120 may be electrically coupled to the high-level signal terminal to serve as the source electrode of the thin film transistor; and the first electrode 110 is electrically coupled to the low-level signal terminal to serve as the drain electrode of the thin film transistor.

In an embodiment, in order to obtain the active layer made of low temperature polysilicon in which crystal grains are oriented in an annular shape, the thin film transistor may further include a light shielding layer B as shown in FIG. 3. The light shielding layer B is disposed on a side of the active layer in a thickness direction, and for example, the light shielding layer B is disposed on a side of the active layer proximal to the base substrate A. Specifically in the embodiment shown in FIG. 3, the light shielding layer B is disposed between the base substrate A and the active layer, and an orthographic projection of the active layer body 101 on the light shielding layer B is within the light shielding layer B, i.e., the orthographic projection of the active layer body 101 on the light shielding layer B is overlapped, for example, completely overlapped, with the light shielding layer B. In an embodiment of the present disclosure, the active layer body 101 has an annular shape, and the light shielding layer B may have a circular shape. A diameter of the light shielding layer B is the same as an outer diameter of the active layer body 101.

Figure 6:
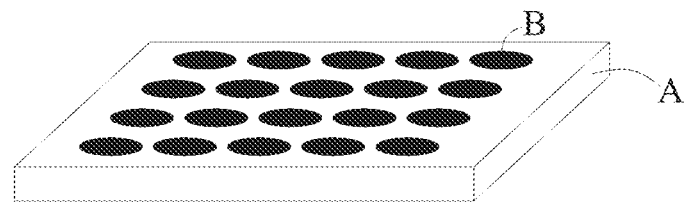
FIG. 6 is a schematic view showing a formation of a light shielding layer in the method for manufacturing an array substrate according to an embodiment of the present disclosure.
Figure 7:
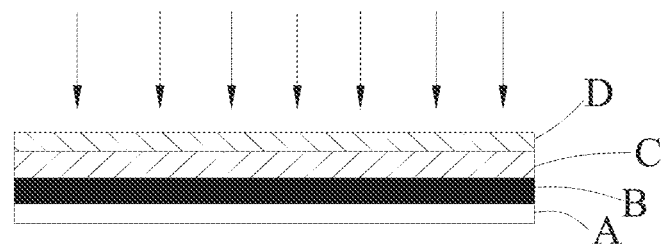
FIG. 7 is a schematic view showing performing an annealing process on the amorphous silicon layer according to an embodiment of the present disclosure.
Figure 8:
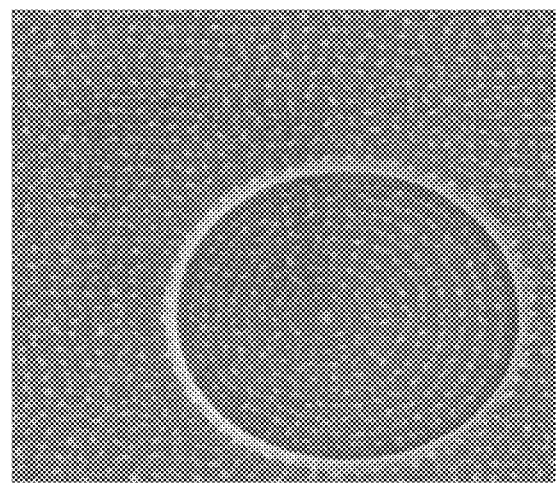
FIG. 8 is a scanned picture of an annealed polysilicon layer obtained after an annealing process.

FIG. 6 shows a step in a method for manufacturing a plurality of thin film transistors. As shown in FIG. 6, a plurality of light shielding layers B are formed on the base substrate A. As shown in FIG. 7, a buffer layer C and an amorphous silicon layer D are formed subsequently on each light shielding layer B. Subsequently, laser annealing process is performed on the amorphous silicon layer D (the solid arrows in FIG. 7 shows an irradiation direction of the laser light) to obtain a polysilicon layer. When the laser annealing process is performed, since the laser beam is irradiated on the amorphous silicon material above the circular light shielding layer, the light shielding layer may cause a change in a direction of the light field (including the light field formed by reflection and the light field formed by reflection) on the surface of the amorphous silicon layer, which causes the temperature field distribution in the amorphous silicon layer to be affected. Since the light shielding layer has a circular shape, the temperature field in the portion of the polysilicon layer above the light shielding layer has a circular distribution, such that the crystal grains of polysilicon having an annular orientation can be formed during the annealing process. Specifically, as shown in FIG. 8, the crystal grains in the portion of the polysilicon layer corresponding to the light shielding layer B have an annular orientation. The polysilicon layer in which the crystal grains have an annular orientation is patterned to form the active layer of the thin film transistor, and the thin film transistor having the active layer has good electrical properties.

In an embodiment, the light shielding layer can be made of molybdenum. In this embodiment, the thin film transistor further includes the buffer layer C disposed between the light shielding layer B and the active layer body 101. For example, the buffer layer C may be made of silicon nitride or silicon oxide. In another embodiment, the buffer layer C may include a layer of silicon nitride and a layer of silicon oxide. In the present disclosure, the light shielding layer B may have a thickness in a range of 100 nm to 300 nm. In another embodiment, the light shielding layer B may have a thickness of 200 nm.

The buffer layer may have a thickness in a range of 100 nm to 500 nm. In a case that the buffer layer includes a layer of silicon oxide and a layer of silicon nitride, the layer of silicon nitride may have a thickness in a range of 50 nm to 150 nm, and the layer of silicon oxide may have a thickness in a range of 100 nm to 350 nm.

In order to ensure an ohmic contact between the first electrode and the active layer body and an ohmic contact between the second electrode and the active layer body, in an embodiment, a portion of the active layer body that is in contact with the first electrode and a portion of the active layer body that is in contact with the second electrode may be doped with dopants after a pattern of the active layer is obtained.

Figure 4:
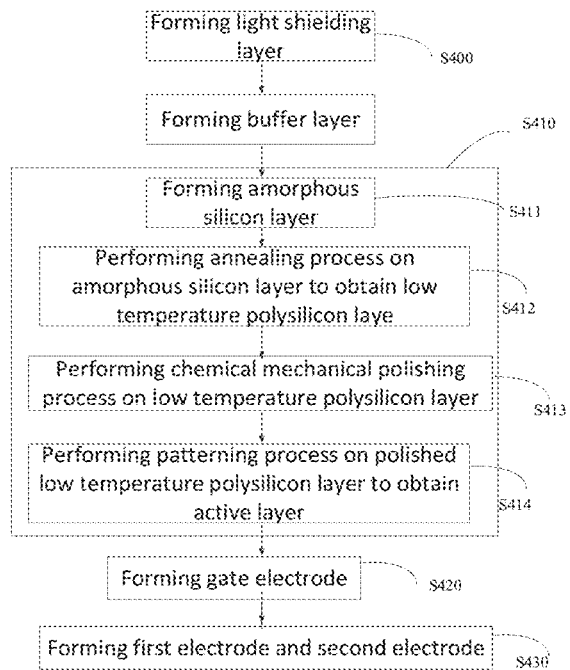
FIG. 4 is a flow chart of a method for manufacturing a thin film transistor according to an embodiment of the present disclosure.

As another aspect of the present disclosure, a method for manufacturing a thin film transistor is provided, where the thin film transistor is the above-described thin film transistor according to the present disclosure, and the manufacturing method includes step 410, step 420, and step 430, as shown in FIG. 4.

At step S410, an active layer including an active layer body and an electrode hole formed in the active layer body is formed.

At step S420, a gate electrode which is insulated from the active layer body is formed.

At step S430, a first electrode and a second electrode are formed. At least a portion of an orthographic projection of the first electrode on the active layer is inside the electrode hole, and an orthographic projection of the second electrode on the active layer surrounds the active layer body. The first electrode and the second electrode are both in contact with the active layer body. The first electrode and the second electrode are insulated and spaced apart from each other, respectively coupled to the active layer body, and insulated and spaced apart from the gate electrode. In an embodiment, the orthographic projection of the second electrode on the active layer is overlapped, for example, completely overlapped, with an outer edge of the active layer body. In an embodiment, an outer profile of the active layer body 101 is inside an outer profile of the orthographic projection of the second electrode 120 on the active layer, and the outer profile of the orthographic projection of the second electrode 120 on the active layer surrounds or encircles the outer edge of the active layer body 101.

The above thin film transistor according to the present disclosure can be manufactured using the manufacturing method provided by the present disclosure. The structure, working principle and beneficial effects of the thin film transistor have been described in detail above, and the details thereof are omitted herein.

In order to prevent an affection of a light on the active layer, as shown in FIG. 4, the manufacturing method further includes forming a light shielding layer before the formation of the active layer.

At step S400, the light shielding layer is formed. As described above, the formation of the light shielding layer facilitates obtaining of an active layer body in which crystal grains have an annular orientation. As described above, the orthographic projection of the active layer body on the light shielding layer is within the light shielding layer. In a case that the electrode hole has a circular shape, the light shielding layer has a circular shape too. In an embodiment, the light shielding layer is made of molybdenum.

As described above, the manufacturing method further includes forming a buffer layer between step S400 and step S410.

The buffer layer can prevent the active layer body from being polluted by the material of the light shielding layer.

In the case where the light shielding layer is made of molybdenum, the light shielding layer is formed by magnetron sputtering at step S400.

As described above, the buffer layer may be made of silicon oxide and/or silicon nitride.

In an embodiment, the buffer layer can be deposited by plasma enhanced chemical vapor deposition (PECVD).

The buffer layer may include a layer of silicon nitride having a thickness of 50 nm-150 nm and a layer of silicon oxide having a thickness of 100 nm-350 nm. Accordingly, the formation of the buffer layer includes: forming a layer of silicon nitride; and forming a layer of silicon oxide.

In a case where the active layer is made of a low temperature polysilicon material, the formation of the active layer at step S410 may include step S411 to step S414.

At step S411, an amorphous silicon layer is formed.

At step S412, an annealing process is performed on the amorphous silicon layer to obtain a low temperature polysilicon layer.

At step S413, a chemical mechanical polishing process is performed on the low temperature polysilicon layer.

At step S414, a patterning process is performed on the polished low temperature polysilicon layer to obtain the active layer.

At step S411, the amorphous silicon layer may be formed by a plasma enhanced chemical vapor deposition method, and the resultant amorphous silicon layer may have a thickness in a range of 30 nm to 60 nm.

In the present disclosure, the annealing process on the amorphous silicon layer at step S412 is not particularly limited. In an embodiment, step S412 may include step S412a and S412b.

At step S412a, the amorphous silicon layer is preheated, the preheating temperature is in a range of 400° C. to 450° C., and the preheating time may be in a range of 0.5 hour to 3 hours.

At step S412b, an excimer laser annealing process is performed on the preheated amorphous silicon layer (as shown in FIG. 7), where the laser pulse frequency is 300 Hz, the overlap ratio is 92% to 98%, the laser scanning rate is 9.6 mm/s to 2.4 mm/s, and the laser energy density is 300 mJ/cm$^2$ to 500 mJ/cm$^2$. Specifically, the excimer laser annealing process can be performed using an excimer laser, such as any one of a xenon chloride excimer laser (with a wavelength of 308 nm), a krypton fluoride excimer laser, and an argon fluoride excimer laser. Further, the excimer laser annealing process can be performed using a solid-state laser (for example, a green laser with a wavelength of 532 nm).

In the annealing process using the excimer laser, the formation of the light shielding layer provides an advantage in that the polysilicon crystal grains having an annular orientation are formed in a portion of the polysilicon layer corresponding to the light shielding layer when the amorphous silicon layer is re-crystallized and formed into the polysilicon layer. When the laser beam is irradiated onto the amorphous silicon material above the circular light shielding layer, the circular light shielding layer may cause a change in a direction of the light field (including the light field formed by reflection and the light field formed by reflection) on the surface of the amorphous silicon layer, which causes the temperature field distribution in the amorphous silicon layer to be affected. Since the light shielding layer has a circular shape, the temperature field in a portion of the polysilicon layer above the light shielding layer has a circular distribution, such that the polysilicon crystal grains having an annular orientation can be formed during the annealing process.

At step S413, a chemical mechanical polishing process may be performed on the low temperature polysilicon layer to remove protrusions and an oxide layer on the surface of the polysilicon layer, thereby improving electrical properties of the low temperature polysilicon layer.

Step S414 can include the following steps: performing patterning process on the polished low temperature polysilicon layer to obtain an initial pattern of the active layer, the initial pattern of the active layer is consistent with the pattern of the active layer; performing a threshold voltage doping (i.e., a threshold voltage-related doping, Vth doping) process on the initial pattern of the active layer; and performing a clean process on the doped initial pattern of the active layer using hydrogen fluoride to obtain the active layer.

In order to obtain the specific structure shown in FIG. 3, the manufacturing method includes the formation of a gate insulating layer performed between the formation of the active layer and the formation of the gate electrode. The gate electrode is provided around the electrode hole.

The manufacturing method further includes the following steps performed between the formation of the gate electrode (step S420) and the formation of the first electrode and the second electrode (step S430): forming an insulating spacer layer covering the gate electrode to insulate and space apart the first electrode and the second electrode from the gate electrode through the insulating spacer layer; forming a first via-hole and a second via-hole which penetrate through the insulating spacer layer and the gate insulating layer; and filling a material of the first electrode in the first via-hole to form a first connection portion 1, and filling a material of the second electrode in the second via-hole to form a second connection portion 2, where the first electrode is coupled to the active layer body via the first via-hole, and the second electrode is coupled to the active layer body via the second via-hole, as shown in FIG. 3.

In order to improve the performance of the thin film transistor, the manufacturing method further includes a hydrogenation process step performed after the first via-hole and the second via-hole are formed.

In another embodiment, an orthographic projection of the electrode hole on the base substrate has a circular shape, an orthographic projection of the active layer body on the base substrate has an annular shape, an orthographic projection of the first electrode on the base substrate has a circular shape, an orthographic projection of the second electrode on the base substrate has an annular shape, and an orthographic projection of the gate electrode on the base substrate has an annular shape. In another embodiment, the orthographic projection of the electrode hole on the base substrate has a square shape, the orthographic projection of the active layer body on the base substrate has a square-hole shape, the orthographic projection of the first electrode on the base substrate has a square shape, and orthographic projections of the second electrode and the gate electrode on the base substrate both have a square-hole shape. It should be noted that the shapes of the electrode hole, the active layer body, the first electrode, the gate electrode, and the second electrode are not limited thereto, as long as uniform transmission of the carriers in various directions can be realized.

Since the thin film transistor is a microelectronic device, a base substrate is required to be provided first when the thin film transistor is manufactured. In order to improve the adhesion of the thin film transistor on the base substrate, the manufacturing method includes a pre-cleaning process on the base substrate after the base substrate is provided.

As a third aspect of the present disclosure, an array substrate including a thin film transistor is provided, where the thin film transistor is the above-described thin film transistor according to the present disclosure.

As described above, since the thin film transistor according to the present disclosure has better electrical properties, the array substrate can have better electrical properties, and a display device including the array substrate can have a better display effect.

In the present disclosure, the position of the thin film transistor is not particularly limited, the array substrate includes a display region and a peripheral region disposed on at least one side of the display region. The array substrate includes a plurality of data lines and a plurality of gate lines. The plurality of data lines are interlaced with the plurality of the gate lines, so that the display region is divided into a plurality of pixel units. Each of the pixel units is provided with a pixel circuit therein, and the pixel circuit includes at least one thin film transistor.

Figure 5:
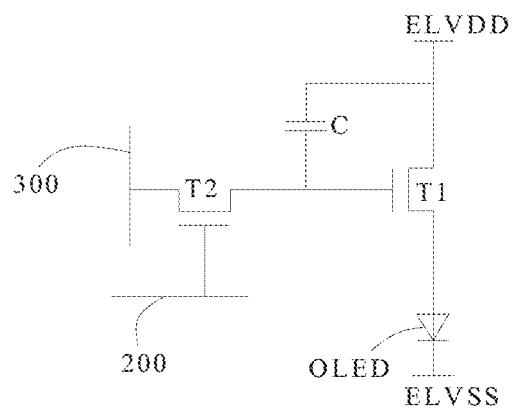
FIG. 5 is a schematic diagram of a pixel circuit in an array substrate according to an embodiment of the present disclosure.

The array substrate according to the present disclosure is particularly applied to an organic light-emitting diode display device. In this embodiment, as shown in FIG. 5, a light-emitting diode OLED is disposed in each pixel unit. The pixel circuit includes a storage capacitor C, a driving transistor T1, and a switching transistor T2.

The driving transistor T1 is the above-mentioned thin film transistor according to the disclosure. A first electrode of the driving transistor T1 is electrically coupled to a high-level signal terminal ELVDD, a second electrode of the driving transistor T1 is electrically coupled to an anode of the light-emitting diode OLED, a gate electrode of the driving transistor T1 is electrically coupled to a first end of the storage capacitor C, and a second end of the storage capacitor C is electrically coupled to the first electrode of the driving transistor T1.

A gate electrode of the switching transistor T2 is electrically coupled to a corresponding gate line 200, a first electrode of the switching transistor T2 is electrically coupled to a corresponding data line 300, and a second electrode of the switching transistor T2 is electrically coupled to the gate electrode of the driving transistor T1.

FIG. 5 shows a pixel circuit having two transistors and a storage capacitor (2T1C structure). Since the pixel circuit has a simple structure, the area of each pixel unit can be reduced. Thereby, more pixel units can be disposed on the array substrate, such that the display device including the more pixel units has a higher resolution.

As described above, since the driving transistor T1 is the above-described thin film transistor according to the present disclosure, the threshold voltage of the driving transistor T1 does not drift, therefore a compensation module may not be provided in the pixel circuit.

In the present disclosure, the respective electrodes of the driving transistor can be electrically coupled to corresponding signal lines via lead wires.

In the present disclosure, the switching transistor T2 is not limited to a specific structure. For example, the switching transistor T2 is also the above-mentioned thin film transistor according to the present disclosure, therefore the switching transistor T2 can have better switching performance.

As a fourth aspect of the present disclosure, a display device including an array substrate is provided, where the array substrate is the above-described array substrate according to the present disclosure.

In a case that a pixel circuit in the display device has the 2T1C structure, the display device can have a resolution as high as 1200 PPI (Pixels Per Inch), or even 1500 PPI.

The display device may include an electronic device such as a television, a mobile phone, a tablet computer, an AR/VR device, or the like.

As a fifth aspect of the present disclosure, a method for manufacturing an array substrate is provided, where the array substrate is the above-described array substrate according to the present disclosure, and the manufacturing method includes: manufacturing the thin film transistor using the manufacturing method according to the present disclosure.

It should be noted that electronic components such as the pixel circuit, the light-emitting diode, and the like are disposed on the base substrate.

Accordingly, it is necessary to synchronously form a plurality of thin film transistors according to the manufacturing method provided by the present disclosure. For example, in the formation of the light shielding layer, a plurality of light shielding layers B may be formed at the same time on the base substrate A in one step, as shown in FIG. 6.

FIG. 6 shows a step in a method for manufacturing a plurality of thin film transistors. As shown in FIG. 6, a plurality of light shielding layers B are formed on the base substrate A. Subsequently, as shown in FIG. 7, a buffer layer C and an amorphous silicon layer D are formed on each light shielding layer B. Subsequently, a laser annealing process is performed on the amorphous silicon layer D (an irradiation direction of the laser light is shown by solid arrows in FIG. 7), so as to obtain a polysilicon layer. As shown in FIG. 8, the crystal grains in a portion of the polysilicon layer corresponding to the light shielding layer B have an annular orientation.

Likewise, in the remaining steps, respective one of layers of the different thin film transistors is formed synchronously (or simultaneously).

As described above, the array substrate can be applied to an organic light emitting diode display device. Therefore, the method for manufacturing the array substrate can further include the following steps performed after the thin film transistor is formed: forming a planarization layer; forming a via-hole; forming an anode layer including a plurality of anodes, where one of the plurality of anodes is electrically coupled to a second electrode of a corresponding driving transistor on the array substrate via the via-hole penetrating through the planarization layer; forming a pixel defining layer; forming a light-emitting layer; and forming a cathode layer.

It should be understood that the above implementations are merely exemplary embodiments for the purpose of illustrating the principles of the present disclosure, however, the present disclosure is not limited thereto. It will be apparent to those skilled in the art that various changes and modifications can be made without departing from the spirit and essence of the present disclosure, which are also to be regarded as falling within the scope of the present disclosure.

What is claimed is:

1. A thin film transistor, comprising:
 a base substrate:
 an active layer, comprising an active layer body and a through-hole in a center of the active layer body;
 a gate electrode, insulated and spaced apart from the active layer body and surrounding the through-hole; and a first electrode and a second electrode, both located at a side of the gate electrode distal to the base substrate; wherein the first electrode and the second electrode are insulated from each other, both coupled to the active layer body, and insulated and spaced apart from the gate electrode;

wherein at least a portion of an orthographic projection of the first electrode on the active layer is within the through-hole; and an orthographic projection of the second electrode on the active layer surrounds the active layer body.

2. The thin film transistor according to claim 1, wherein the orthographic projection of the second electrode on the active layer is overlapped with an outer edge of the active layer body.

3. The thin film transistor according to claim 2, further comprising a gate insulating layer on a surface of the active layer proximal to the gate electrode, wherein the gate electrode is on a surface of the gate insulating layer distal to the base substrate.

4. The thin film transistor according to claim 3, further comprising an insulating spacer layer on a side of the gate insulating layer distal to the base substrate and covering the gate electrode, wherein the first electrode and the second electrode are on a surface of the insulating spacer layer distal to the base substrate, the first electrode is coupled to the active layer body via a first via-hole penetrating through both the insulating spacer layer and the gate insulating layer, and the second electrode is coupled to the active layer body via a second via-hole penetrating through both the insulating spacer layer and the gate insulating layer.

5. The thin film transistor according to claim 4, wherein an orthographic projection of the through-hole on the base substrate has a circle shape;

an orthographic projection of the active layer body on the base substrate has an annular shape;

an orthographic projection of the first electrode on the base substrate has a circle shape; and each of orthographic projections of the second electrode and the gate electrode on the base substrate has an annular shape.

6. The thin film transistor according to claim 5, wherein an orthographic projection of the first via-hole on the active layer has an annular shape and surrounds the through-hole; and an orthographic projection of the second via-hole on the active layer has an annular shape and surrounds the through-hole.

7. The thin film transistor according to claim 6, wherein the first electrode, the gate electrode, and the second electrode are concentrical.

8. The thin film transistor according to claim 7, wherein the active layer body is made of low temperature polysilicon.

9. The thin film transistor according to claim 8, further comprising a light shielding layer on a side of the active layer proximal to the base substrate, wherein an orthographic projection of the active layer body on the light shielding layer is within the light shielding layer.

10. A display device, comprising the thin film transistor according to claim 1.

11. A method for manufacturing a thin film transistor, comprising:

providing a base substrate;

forming an active layer on a side of the base substrate, wherein the active layer comprises an active layer body and a through-hole in a center of the active layer body;

forming a gate electrode on a same side of the base substrate as the active layer, wherein the gate electrode is insulated and spaced apart from the active layer body and disposed to surround the through-hole; and forming a first electrode and a second electrode both located on a side of the gate electrode distal to the base substrate, wherein the first electrode and the second electrode are insulated and spaced apart from each other, both coupled to the active layer body, and insulated and spaced apart from the gate electrode, wherein at least a portion of an orthographic projection of the first electrode on the active layer is within the through-hole; and an orthographic projection of the second electrode on the active layer surrounds the active layer body.

12. The method according to claim 11, further comprising forming a gate insulating layer on a surface of the active layer proximal to the gate electrode, wherein the gate electrode is on a surface of the gate insulating layer distal to the base substrate.

13. The method according to claim 12, after forming the gate electrode and before forming the first electrode and the second electrode, further comprising:

forming an insulating spacer layer, wherein the insulating spacer layer is on a side of the gate insulating layer distal to the base substrate and covers the gate electrode;

forming a first via-hole and a second via-hole both of which penetrate through both the insulating spacer layer and the gate insulating layer; and filling a material of the first electrode into the first via-hole to form a first connection portion, and filling a material of the second electrode into the second via-hole to form a second connection portion, wherein the first electrode is coupled to the active layer body via the first connection portion, and the second electrode is coupled to the active layer body via the second connection portion.

14. The method according to claim 13, wherein an orthographic projection of the first via-hole on the active layer has an annular shape and surrounds the through-hole; and an orthographic projection of the second via-hole on the active layer has an annular shape and surrounds the through-hole.

15. The method according to claim 14, before forming the active layer, further comprising:

forming a light shielding layer on a side of the active layer proximal to the base substrate, wherein an orthographic projection of the active layer body on the light shielding layer is within the light shielding layer.

16. The method according to claim 15, wherein forming the active layer comprises:

forming an amorphous silicon layer;

performing an annealing process on the amorphous silicon layer to obtain a low temperature polysilicon layer;

performing a chemical mechanical polishing process on the low temperature polysilicon layer; and performing a patterning process on the polished low temperature polysilicon layer to obtain the active layer.

\* \* \* \* \*